THERMOELECTRIC DEVICES

Filed May 29, 1962 3 Sheets-Sheet 1

Inventors:
Charles N. Rollinger and
James E. Sunderland
By: C. G. Stallings Atty.

Inventors:
Charles N. Rollinger and
James E. Sunderland
By: C. G. Stallings Atty.

Inventors: Charles N. Rollinger
and James E. Sunderland
By: C. G. Stallings Atty.

United States Patent Office 3,199,302
Patented Aug. 10, 1965

3,199,302
THERMOELECTRIC DEVICES

Charles N. Rollinger, Colorado Springs, Colo., and James E. Sunderland, Evanston, Ill.; said Rollinger assignor to Borg-Warner Corporation, Chicago, Ill., a corporation of Illinois, and said Sunderland assignor to Northwestern University, Evanston, Ill., a corporation of Illinois Filed May 29, 1962, Ser. No. 198,541
8 Claims. (Cl. 62—3)

This invention relates to thermoelectric devices and more particularly to heat pumps and power generators utilizing single or plural thermoelectric elements.

The operation of thermoelectric heat pumps is based upon the Peltier effect which covers the phenomenon that when two dissimilar conductors are joined in circuit with a source of direct current, heat is absorbed at one of the junctions and liberated at the other. Thermoelectric power generators rely upon the Seebeck effect wherein when two junctions in a closed circuit defined by two dissimilar materials are maintained at different temperatures, a steady electric current will flow in the closed circuit. The electromotive force causing the current in the Seebeck arrangement is proportional to the temperature difference between the two junctions, and a function also of the materials making up the circuit commonly referred to as a thermocouple. Thermoelectric materials are considered to be of two general types, P and N, based upon their electrical carrier characteristics. A P-type thermoelectric material has predominately electron holes as carriers; whereas, the carriers of the N-type material are electrons.

Only until recently has the practical application of Peltier heat pumping and Seebeck power generation approached the realm of feasibility with the development of semiconductors many of which exhibit Seebeck and Peltier coefficients markedly greater than that of pure conductors. Examples of such semiconductor materials are bismuth telluride and lead telluride.

The heat pumping and power generating capabilities of thermoelectric materials are based not only on the Peltier and Seebeck coefficients, $\pi$ and S, but also on the electrical resistivity $\rho$ and the thermal conductivity $k$ of the material. Low resistivity: i.e., high electrical conductivity, is desirable to reduce Joulean heating to a minimum; i.e., $I^2R$, where I denotes current through the element and R denotes the resistance of the element. Also, since a temperature difference exists across the length of the element by the establishment of the cold and hot junctions, a low thermal conductivity of the thermoelectric material is desirable to minimize the flow of heat from the hot junction toward the cold junction.

Much research is currently being carried on in an effort to develop thermoelectric materials having these desirable characteristics (high Peltier and Seebeck coefficients, low electrical resistivity, and low thermal conductivity). These characteristics can be combined in a relationship denoting the relative merit of the specific material for utilization in Peltier heat pumping or Seebeck power generation. This relationship, termed the figure of merit, can be expressed thus:

$$Z=\frac{S^2}{k\rho}$$

The effect of surface heat transfer; i.e., heat transfer from the longitudinal surface of a thermal element has generally been considered to be undesirable under all conditions of operation. This invention demonstrates, however, that by critically controlling such heat transfer by a unique arrangement of thermal insulation, the operation of thermoelectric devices can be greatly improved.

An object, therefore, of this invention is to provide improved thermoelectric devices arranged to be operated as Peltier pumps and for power generators, providing superior performance.

Another object of this invention is to provide a thermoelectric heat pump having improved maximum temperature differential capabilities.

Another object of this invention is the provision of a thermoelectric heat pump having improved maximum heat pumping capacity.

Another object of this invention is to provide a thermoelectric heat pump exhibiting improved coefficient of performance.

Another object of this invention is to provide an improvide thermoelectric power generator having increased power output.

Another object of this invention is to provide an improved thermoelectric power generator having increased thermal efficiency.

Still another object of this invention is the provision of thermoelectric devices utilizing controlled heat transfer along the surface of the thermoelement or elements in a predetermined manner to improve performance.

In accordance with this invention the performance of a thermoelectric device employing thermoelements is improved by providing a critical length of thermal insulation extending from one juncture toward the other junction a predetermined distance less than the total length of the element so that, by surface heat transfer along the uninsulated portion of the element caused by convective or forced heat exchange with the environment, some of the heat contained in this portion of the element is removed and thus prevented from being conducted by the element to the junctions.

Further objects and features of this invention will become apparent from the following detailed description, when taken in connection with the accompanying drawings, in which:

FIGURE 1, partially schematic, illustrates a single thermoelectric element heat pump embodying this invention;

Figure 5:
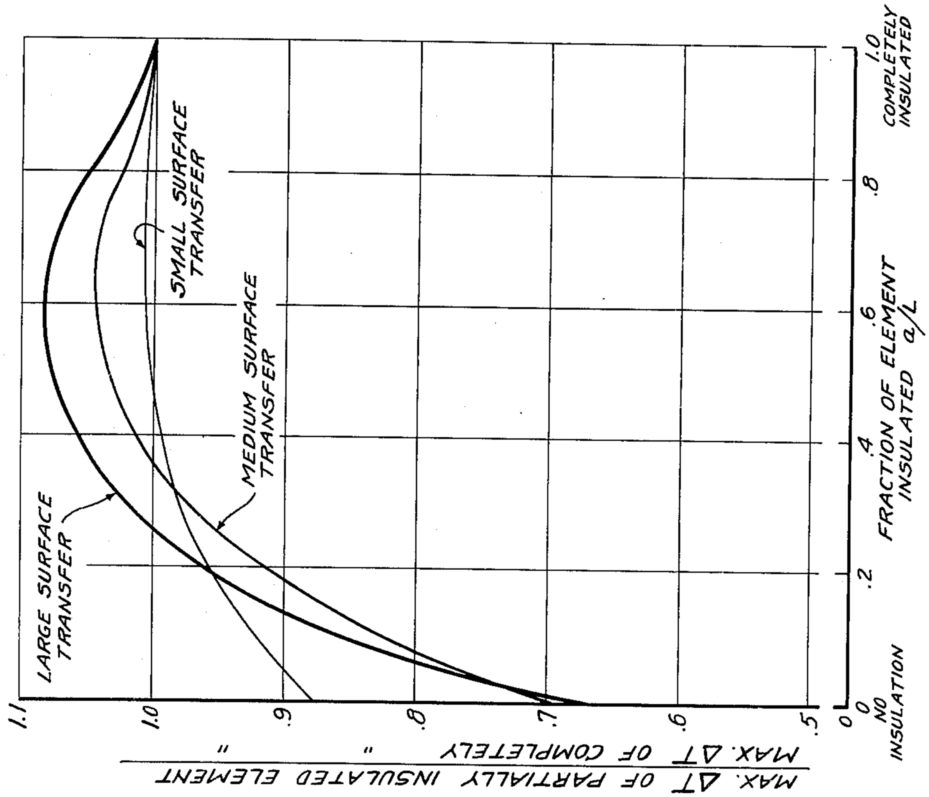
Figure 4:
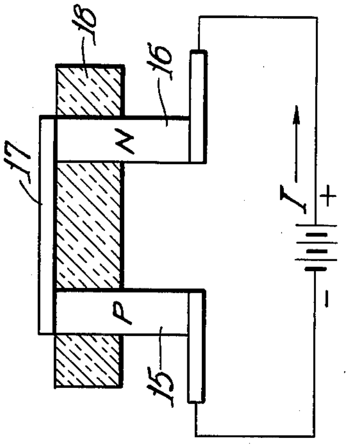
Figure 7:
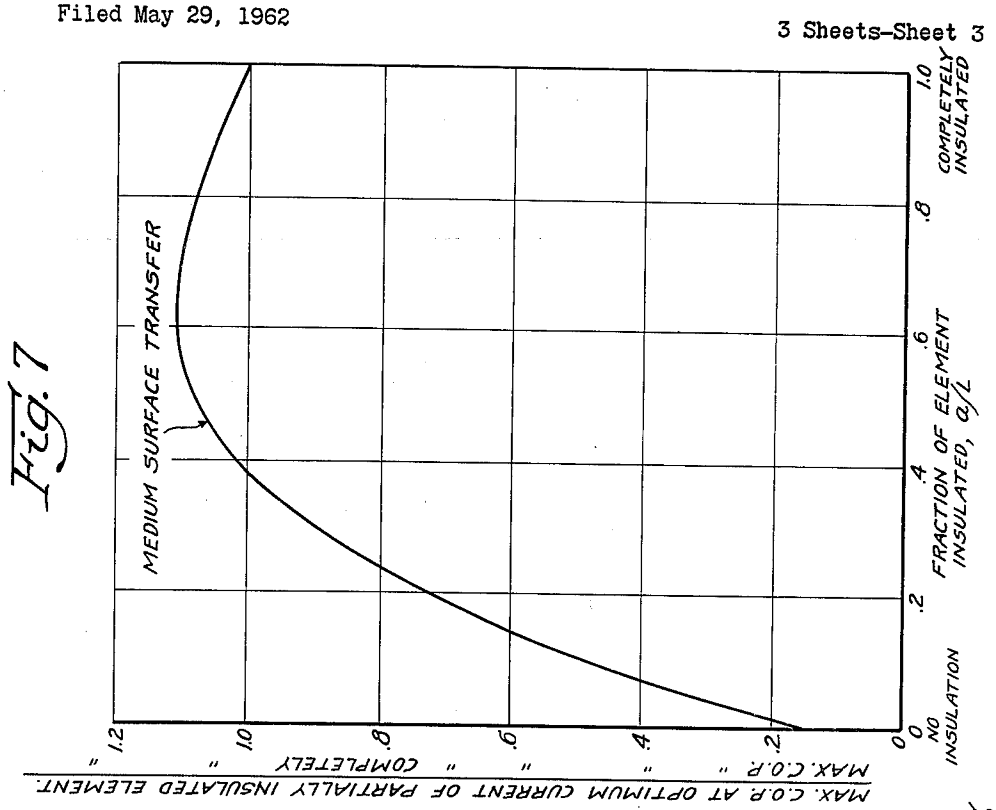
Figure 6:
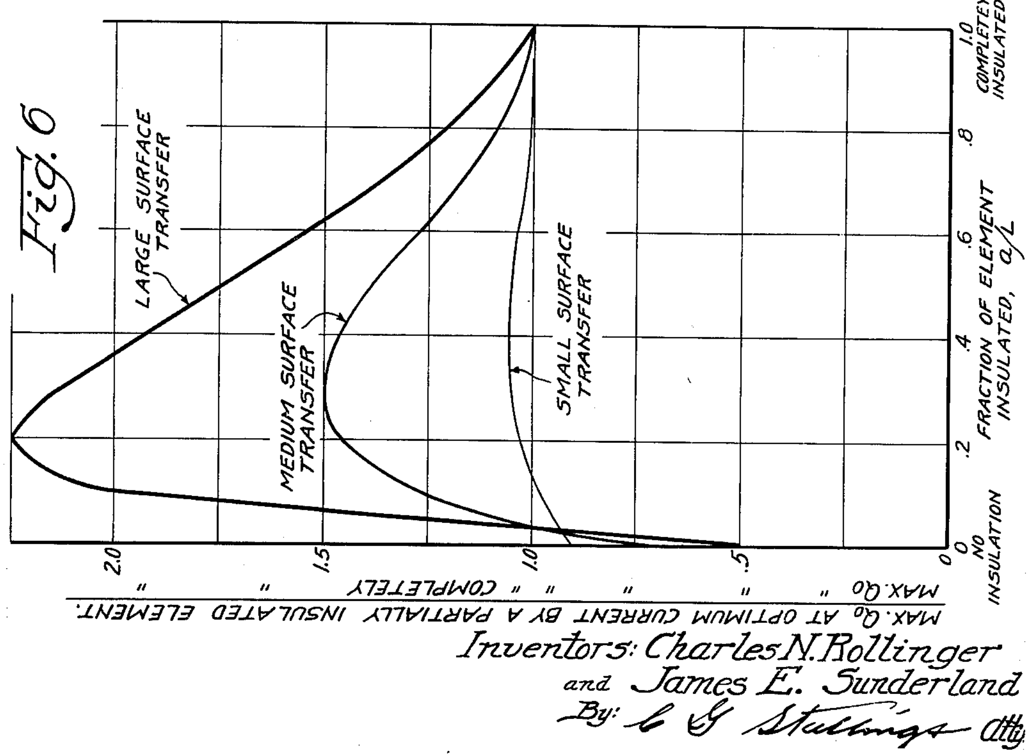

FIGURE 4, partially schematic, illustrates a double thermoelectric element heat pump employing thermoelectric elements of opposite polarity embodying this invention;

FIGURE 5 is a graphic illustration depicting the increase in maximum temperature difference obtainable by use of this invention;

FIGURE 6 graphically illustrates the improvement in heat pumping capacity realized by this invention; and FIGURE 7 graphically illustrates the increase in the coefficient of performance obtainable by this invention.

Figure 1:
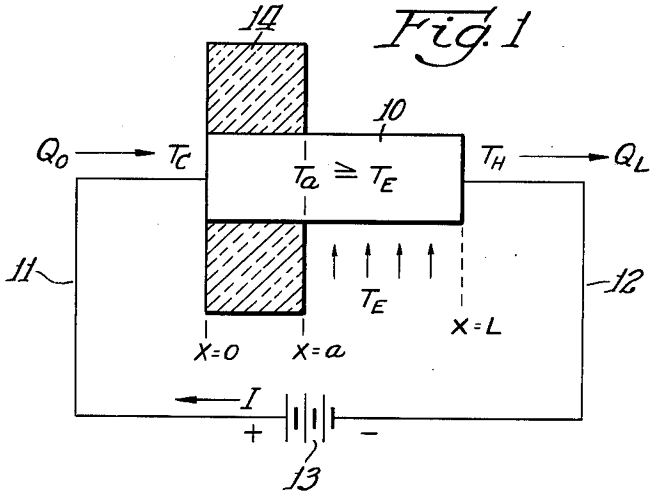

FIGURE 1 depicts a thermoelectric element 10, of P-type material, for example, connected by electrical conductors 11 and 12 to a source of direct current, here illustrated as a battery 13. With this connection current flows into the left end of the element and out the right end. The characteristic of P-type semiconductor material is such that the junction into which the current flows absorbs heat, becomes cold, and the junction out of which the current flow liberates heat, becomes heated. The cold junction is thus illustrated as $T_C$ and the hot junction as $T_H$. $Q_O$ heat will be absorbed by the cold junction and $Q_L$ heat expelled at the hot junction when adequate heat sink and radiation surfaces are provided.

Thermal insulation 14 is provided flush with the cold junction and extends toward the hot junction a distance *a*. The uninsulated portion of the thermoelement and the hot junction $T_H$ with its associated heat sink, not shown, are exposed to an environment having a given temperature $T_E$.

The performance of a thermoelectric element or elements operated as Peltier heat pumps can be characterized as follows: The maximum temperature differential between the hot and cold junctions, the maximum heat pumping capacity and the maximum coefficient of performance, C.O.P.

The maximum temperature difference ($\Delta T$) max. is a measure of the temperature differential established between the cold and hot junctions with zero loading of the cold junction; i.e., when $Q_O=0$. Maximum heat pumping capacity is depicted as ($Q_O$) max. The maximum coefficient of performance C.O.P. is the ratio of the total heat energy absorbed at the cold junction $Q_O$ to the total power required to pump this heat energy $P_e$; i.e., $Q_O/P_e$.

Figure 2:
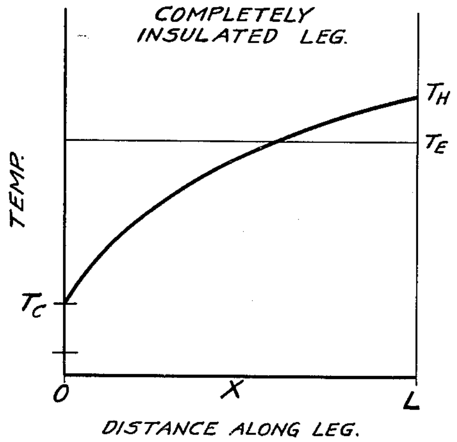
FIGURE 2 is a graphic illustration of the approximate temperature distribution curve of a thermoelectric element employed as a heat pump not employing the features of this invention.

Due to the differential temperature between the cold and hot junctions a temperature distribution is established along the length of the thermal element from $X=0$ to $X=L$. If thermal element 10 of FIGURE 1 were completely insulated, the temperature distribution curve would take the form graphically illustrated in FIGURE 2 for maximizing $\Delta T$ in which the abscissa is the length of the element from $X=0$ to $X=L$ and the ordinate is the temperature scale. A horizontal reference line is positioned on the temperature scale at the temperature of the environment $T_E$.

Figure 3:
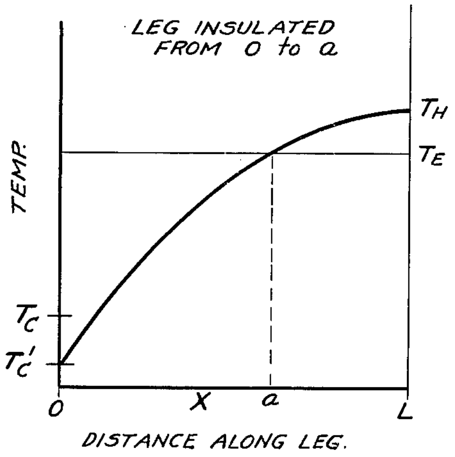
FIGURE 3 is a graphic illustration of the approximate temperature distribution curve of a thermoelectric element employed as a heat pump employing the features of this invention.

If the thermal element is to operate as a Peltier pump provision must be made for the removal of heat from the hot junction by heat exchange with the ambient environment. Thus, if the temperature of the environment exceeds that of the hot junction it is impossible for the element to function as a Peltier pump. Assuming then that the environment has a given temperature $T_E$ having a magnitude less than that of the hot junction, $T_E<T_H$, and that at some point, $x=a$, the temperature of the thermoelement equals that of the given environment temperature, $T_a=T_E$, the provision of insulation 14 surrounding the element and extending from the cold junction toward the hot junction to this point, $x=a$, or slightly beyond will modify the temperature distribution curve of FIGURE 2 to that illustrated in FIGURE 3 for the case for maximizing $\Delta T$. The insulation for satisfying the above extends from $x=0$ to $x=a$, and from $T_C$ to the point that the temperature distribution curve intersects the reference line $T_E$ of FIGURE 3. By comparing the partially insulated curve of FIGURE 3 to the completely insulated curve of FIGURE 2 it is seen that the temperature of the cold junction is lowered from $T_C$ to $T_C'$. This occurs because advantage is taken of convective or forced cooling of the uninsulated portion, from $x=a$ to $x=L$, of the thermoelement, the temperature of which exceeds that of the environment temperature $T_E$, thus dissipating some of the pumped heat and $I^2R$ heat that would otherwise be conducted by the element to the cold junction.

FIGURE 4 illustrates a plural thermoelectric Peltier pump employing two separate thermoelectric elements 15 and 16, one of P-type semiconductor material and the other N-type joined in a U-configuration by a conductive bar 17. The other ends of the elements are connected to a source of direct current, here shown again as a battery. The same principles discussed with regard to FIGURE 1 also apply to a double or plural element Peltier pump. In FIGURE 4, conductive bar 17 forms the cold junction for both elements and thermal insulation 18 extends therefrom toward the hot junctions the critical distance where the temperature of the elements equal the given environmental temperature $T_E$.

Several elements such as shown in FIGURE 4 could be connected in thermal parallel and electrical series with the same considerations as to the placement of the insulation: i.e., from the common cold junctions down the thermoelements toward the hot junctions to a point where the temperature of the elements equals or slightly exceeds the temperature of the environment.

FIGURE 5 is a plot of the maximum temperature difference obtainable as a function of the fraction of the element insulated, $a/L$, for three different values of surface heat transfer dependent upon the rate of convection or forced cooling. These curves are normalized with 1.0 on the vertical scale depicting max. $\Delta T$ for a fully insulated element. It is readily seen from these curves that the maximum temperature difference is increased by the critical placement, to $x=a$, of partial insulation extending from the cold junction toward the hot junction. Similarly, FIGURES 6 and 7 graphically illustrate the increases in maximum heat pumped and maximum C.O.P., respectively, by the critical placement of partial insulation. These latter figures are also normalized with 1.0 on the vertical scale depicting max. $Q_O$ and max. C.O.P. for a fully insulated element.

The environment to which the uninsulated portion of the element or elements is exposed can be air, other gases or liquid and the mode of heat exchange can be convective, forced, such as by blower or pump, and partially by radiation.

From the foregoing it will be readily apparent that by this invention, the heat transfer along the longitudinal surface of the thermoelement employed as a Peltier heat pump or power generator is controlled by the placement of thermal insulation from one junction toward the other junction to a point where a critical temperature of the element is reached, thereby improving the performance of the thermoelectric device operated either as a Peltier pump or power generator; and more specifically improving the performance of a Peltier pump as to maximum temperature difference, maximum heat pumping capacity and maximum C.O.P., and power output and efficiency of a thermoelectric power generator.

While this invention has been described in connection with certain specific embodiments thereof, it is to be understood that this is by way of illustration and not by way of limitation and the scope of this invention is defined solely by the appended claims which should be construed as broadly as the prior art permits.

What is claimed is:

1. In a thermoelectric device comprising means defining at least a single thermoelectric element; means to produce a cold junction and a hot junction; means defining thermal insulation about said thermoelement, said last means characterized by being extended from substantially adjacent one of said junctions toward the other of said junctions a predetermined distance less than the total length of said element to a point where the temperature of said element at least equals the temperature of the environment, the ratio of said predetermined distance of insulation extent to said total length of the element being in the range of 0.03 to 0.97, and said last means being effective to define an insulated zone along said element a distance which is a function of the temperature along said element, the remaining uninsulated portion of said element being exposed to the ambient environment, the temperature of ambient environment being lower than the temperature of the hot junction, whereby the temperature difference between said junctions is maximized.

2. In a thermoelectric heat pump comprising at least a single thermoelectric element, electrical conductors and a source of direct current joined in circuit to provide at least one cold junction and one hot junction, thereby establishing a temperature distribution along said element between said junctions; said element being adapted to be exposed to an environment having a temperature $T_E$ which is lower than the temperature at the hot junction; thermal insulation surrounding said element and characterized by extending from said cold junction toward said hot junction to a point where the temperature of said element at least equals said temperature $T_E$, but less than the total length of said element, the ratio of the extent of thermal insulation to the total length of the element being in the range of 0.03 to 0.97.

3. In a thermoelectric heat pump comprising at least a single thermoelectric element, electrical conductors and a source of direct current joined in circuit to provide at least one cold junction and one hot junction, thereby establishing a temperature distribution along said element between said junctions; said element being adapted to be exposed to an environment having a temperature $T_E$ which is lower than the temperature at the hot junction; thermal insulation surrounding said element and characterized by extending from said cold junction toward said hot junction to a point where the temperature of said element substantially equals said temperature $T_E$, but less than the total length of said element, the ratio of the extent of thermal insulation to the total length of the element being in the range of 0.03 to 0.97.

4. In a thermoelectric heat pump comprising at least a single thermoelectric element, electrical conductors and a source of direct current joined in circuit to provide at least one cold junction and one hot junction, thereby establishing a temperature distribution along said element between said junctions; said element being adapted to be exposed to an environment having a temperature $T_E$ which is lower than the temperature at the hot junction; thermal insulation surrounding said element and characterized by extending from said cold junction toward said hot junction an incremental distance beyond the point where the temperature of said element equals said temperature $T_E$, but less than the total length of said element, the ratio of the extent of thermal insulation to the total length of the element being in the range of 0.03 to 0.97.

5. In a thermoelectric heat pump comprising at least a single thermoelectric element, electrical conductors and a source of direct current joined in circuit to provide at least one cold junction and one hot junction thereby establishing a temperature distribution along said element between said junctions; said element being adapted to be exposed to an environment having a temperature $T_E$ which is lower than the temperature at the hot junction; thermal insulation surrounding said element and characterized by extending from said cold junction toward said hot junction to a point where the temperature of said element at least equals said temperature $T_E$, but less than the total length of said element, the ratio of the extent of thermal insulation to the total length of the element being in the range of 0.03 to 0.97; the uninsulated portion of said element being in heat exchange relation with said environment.

6. In a thermoelectric heat pump comprising at least a single thermoelectric element, electrical conductors and a source of direct current joined in circuit to provide at least one cold junction and one hot junction, thereby establishing a temperature distribution along said element between said junctions; said element being adapted to be exposed to a fluid environment having a temperature $T_E$ which is lower than the temperature at the hot junction; thermal insulation surrounding said element and characterized by extending from said cold junction toward said hot junction to a point where the temperature of said element at least equals said temperature $T_E$, but less than the total length of said element, the ratio of the extent of thermal insulation to the total length of the element being in the range of 0.03 to 0.97; the uninsulated portion of said element being in heat exchange relation with said fluid environment.

7. In a thermoelectric heat pump comprising at least a single thermoelectric element, electrical conductors and a source of direct current joined in circuit to provide at least one cold junction and one hot junction, thereby establishing a temperature distribution along said element between said junctions; said element being adapted to be exposed to a fluid environment having a temperature $T_E$ which is lower than the temperature at the hot junction; thermal insulation surrounding said element and characterized by extending from said cold junction toward said hot junction to a point where the temperature of said element at least equals said temperature $T_E$, but less than the total length of said element, the ratio of the extent of thermal insulation to the total length of the element being in the range of 0.03 to 0.97; the uninsulated portion of said element being in convective heat exchange relation with said fluid environment.

8. In a thermoelectric heat pump comprising at least a single thermoelectric element, electrical conductors and a source of direct current joined in circuit to provide at least one cold junction and one hot junction, thereby establishing a temperature distribution along said element between said junctions; said element being adapted to be exposed to a fluid environment having a temperature $T_E$ which is lower than the temperature at the hot junction; thermal insulation surrounding said element and characterized by extending from said cold junction toward said hot junction to a point where the temperature of said element at least equals said temperature $T_E$, but less than the total length of said element, the ratio of the extent of thermal insulation to the total length of the elements being in the range of 0.03 to 0.97; the uninsulated portion of said element being in heat exchange relation with said fluid environment by the forced flow of said fluid around said uninsulated portion.

References Cited by the Examiner

UNITED STATES PATENTS

| | | | |
|---|---|---|---|
| 1,818,437 | 8/31 | Stuart | 62—3 |
| 2,779,172 | 1/57 | Lindenblad | 62—3 |
| 2,906,801 | 9/59 | Fritts | 136—4.2 |
| 2,993,340 | 7/61 | Scheckler | 62—3 |
| 3,045,057 | 7/62 | Cornish | 136—5 |

FOREIGN PATENTS

| | | |
|---|---|---|
| 259,564 | 7/27 | Great Britain. |

ROBERT A. O'LEARY, *Examiner.*

WILLIAM J. WYE, *Primary Examiner.*